(12) United States Patent
Dussert-Vidalet et al.

(10) Patent No.: US 8,969,853 B2
(45) Date of Patent: Mar. 3, 2015

(54) ORGANIC LIGHT-EMITTING DIODE WITH MICROCAVITY INCLUDING DOPED ORGANIC LAYERS AND FABRICATION PROCESS THEREOF

(75) Inventors: Bruno Dussert-Vidalet, La Garde (FR); Marco Mazzeo, Monteroni (IT); Guiseppe Gigli, Rome (IT); Mohamed Ben Khalifa, Lecce (IT); Fabio Della Sala, Lecce (IT); Vincenzo Maiorano, Galatina (IT); Fabrizio Mariano, Lecce (IT)

(73) Assignee: Astron Fiamm Safety Sarl, Toulon (FR)

( * ) Notice: Subject to any disclaimer, the term of this patent is extended or adjusted under 35 U.S.C. 154(b) by 1231 days.

(21) Appl. No.: 12/812,689

(22) PCT Filed: Jan. 16, 2009

(86) PCT No.: PCT/EP2009/050504
§ 371 (c)(1),
(2), (4) Date: Dec. 6, 2010

(87) PCT Pub. No.: WO2009/090248
PCT Pub. Date: Jul. 23, 2009

(65) Prior Publication Data
US 2011/0079772 A1 Apr. 7, 2011

Related U.S. Application Data

(60) Provisional application No. 61/024,275, filed on Jan. 29, 2008.

(30) Foreign Application Priority Data

Jan. 18, 2008 (FR) ...................... 08 50303

(51) Int. Cl.
*H01L 29/08* (2006.01)
*H01L 51/50* (2006.01)
*H01L 51/52* (2006.01)

(52) U.S. Cl.
CPC ........ *H01L 51/5052* (2013.01); *H01L 51/5206* (2013.01); *H01L 51/5265* (2013.01); *H01L 2251/558* (2013.01)
USPC ........................ 257/40; 257/E51.018; 438/29

(58) Field of Classification Search
None
See application file for complete search history.

(56) References Cited

U.S. PATENT DOCUMENTS 6,326,224 B1 12/2001 Xu et al.
6,406,801 B1 6/2002 Tokito et al.
(Continued)

FOREIGN PATENT DOCUMENTS

CN 1897775 1/2007
CN 1989787 6/2007
(Continued)

OTHER PUBLICATIONS

CN Office Office Action dated Dec. 23, 2011 in CN Application 200980107267.
(Continued)

*Primary Examiner* — Marvin Payen
(74) *Attorney, Agent, or Firm* — Young & Thompson

(57) ABSTRACT

An organic light emitting diode (OLED) emitting light downward through a transparent substrate. The OLED embeds a microcavity formed between a cathode and an anode and includes a plurality of organic layers including a light emitting layer. The plurality of organic layers include at least a first layer made of an organic doped material aimed at enhancing the transport of electrons; and at least a second layer made of an organic doped material aimed at enhancing the transport of holes. The anode is obtained by deposition of a semitransparent layer of silver (Ag) over the transparent substrate to be directly in contact with the first doped organic layer. Then, thicknesses of the first and second doped organic layers can be freely adapted to best adjust the optical characteristics of the microcavity for the wavelength of monochromatic light to be produced by the OLED.

7 Claims, 3 Drawing Sheets

(56) References Cited

U.S. PATENT DOCUMENTS

| | | |
|---|---|---|
| 2005/0100760 A1* | 5/2005 | Yokoyama .................... 428/690 |
| 2006/0006795 A1* | 1/2006 | Strip .............................. 313/504 |
| 2007/0001570 A1 | 1/2007 | Nomura et al. |
| 2008/0084159 A1 | 4/2008 | Fery et al. |
| 2008/0116450 A1* | 5/2008 | Fong et al. ....................... 257/40 |
| 2009/0015154 A1 | 1/2009 | Ben Khalifa et al. |

FOREIGN PATENT DOCUMENTS

| | | |
|---|---|---|
| JP | 2004228082 A | 8/2004 |
| JP | 2007043104 A | 2/2007 |
| WO | 2006/067200 A2 | 6/2006 |
| WO | 2007/099229 A2 | 9/2007 |

OTHER PUBLICATIONS

International Search Report, dated May 19, 2009, from corresponding PCT application.

C.L. Mulder et al., "Saturated and efficient blue phosphorescent organic light emitting devices with Lambertian angular emisison", Applied Physics Letters, 2007, pp. 211109-211109, vol. 90, No. 21; Cited in International Search Report.

Carsten Rothe, "Electrical doping is paving the way for the implementation of OLEDs in consumer electronics", Laser & Photonics Reviews, 2007, pp. 303-306, vol. 1, No. 4; Cited in International Search Report.

* cited by examiner

Prior Art

ORGANIC LIGHT-EMITTING DIODE WITH MICROCAVITY INCLUDING DOPED ORGANIC LAYERS AND FABRICATION PROCESS THEREOF

FIELD OF THE INVENTION

The present invention refers generally to organic light emitting diodes (OLEDs) and more specifically to an OLED structure including a microcavity that only requires the vacuum deposition of organic and metallic layers to produce high efficiency OLEDs, especially monochromatic OLEDs such as red OLEDs.

BACKGROUND OF THE INVENTION

The OLEDS are electronic devices that emit light when applied a voltage. Tang et al. of the Kodak Company were the first to disclose in 1987, in "Applied Physics Letters", and in 1989 in the "Journal of Applied Physics" OLEDs having high luminance efficiency. Since then, numerous OLED structures with improved characteristics, including those using polymers, have been described.

Such an electronic device, emitting light downward (100), through a transparent substrate (140), is described in FIG. 1. The device includes a lower transparent electrode (130), an organic electroluminescent structure (120) in which an electron-hole type of conduction can take place, and a reflective metallic top electrode (110). Most often the organic electroluminescent structure itself is layered and may include a hole injection layer (129), a hole transport layer (127), a light emitting layer (125) produced by the recombination of holes and electrons, an electron transport layer (123) and an electron injection layer (121). The lower transparent electrode (130) is the anode of the device while the upper reflective metal electrode (110) is the cathode.

The luminance output efficiency is one of the important criteria used to characterize an OLED. It determines how much current or power must be supplied to have OLED delivering a given level of light in output. As the lifespan of an OLED is inversely proportional to its operating current this means that the device having a better efficiency will be able of delivering an identical level of light for a longer period of time.

One of the key parameters that limit the luminance output efficiency of an OLED is the output coupling of the photons generated by the recombination of electrons and holes, i.e., the proportion of photons that can actually escape from the device. Because of the rather high optical indexes of the materials used to form the organic layers and the transparent electrode, most of the photons generated by the recombination process are trapped by internal reflections. They can not leave the device and provide no effective contribution to the output light. Currently, up to 80% of light produced can be lost in this way.

A known method to improve the luminance output efficiency consists in forming a microcavity (MC) in the layered structure as illustrated in FIG. 1b (150). Such a configuration often called MC-OLED is described for example in U.S. Pat. No. 6,406,801. The organic electroluminescent layer (170) is placed between two highly reflective mirrors. The upper mirror is the metallic cathode (160) while the lower mirror (190) is made of alternating layers of multiple materials having different refractive indices (such as oxides of silicon and titanium). This type of multilayered mirror, also called Bragg reflector, is however designed to also transmit light. It is semi transparent to let produced light get out of the device. In this structure the anode (180) is made of an oxide of indium and tin (ITO), which is a transparent conductor material often used for the anodes of OLEDs. Reflective mirrors form a Fabry-Perot resonator, which strongly modifies the emissive properties of the organic electroluminescent structure inserted in the microcavity. The emission of light near the resonance wavelength of the cavity is strengthened while other wavelengths are eliminated or significantly reduced. The use of a microcavity in an OLED is described for example in U.S. Pat. No. 6,326,224 in order to reduce the bandwidth of the emitted light thus improving its color purity.

In structures such as the one described in FIG. 1b, a major obstacle to obtaining OLEDs having optimal performances is that the anode, made of ITO, is a rather poor conductor of electricity when compared, for example, to the metallic cathode. It does not allow to get a very low sheet resistance ($\Omega$/cm2) (181) unless to have a very thick anode which is not possible however without directly impacting the optical properties of the microcavity formed between the upper metal layer, the cathode, and a reflecting lower mirror situated under the anode. In this structure, the optimization of the microcavity optical parameters (optical length) is not independent of the electrical parameters. Thus, the injection of current in the anode to get the specified brightness level generally causes thermal heating which is very detrimental for the lifespan of the organic layers situated immediately above. In addition, a significant voltage drop can be seen along the section of the device that does not permit to obtain identical operational characteristics over the whole surface. Finally, it should be noted that ITO is an expensive material.

Another drawback of the structure shown in FIG. 1b is the complexity of the multilayered lower mirror. To be fabricated it requires the deposition of multiple layers of materials alternating different refractive indexes with a technique known as sputtering.

In order to overcome the above problems, the replacement of the anode made of ITO by a simple semi-transparent metal layer has recently been experimented and results published by Peng et al. in "Applied Physics Letters 87", 173505, 2005 in a paper untitled: "Efficient organic light-emitting diode using semitransparent silver as anode". The structure disclosed in this publication indeed gets rid of the complex lower multilayered mirror since the semi transparent metallic anode also acts as a mirror to create the microcavity with the upper metallic electrode.

Although silver (Ag) has the highest electrical conductivity among all metals commonly used by the microelectronics industry, is less expensive than ITO, has excellent optical properties (low absorption over the range of visible light) and can simply be deposited by thermal vacuum evaporation, it has also, unfortunately, a relatively low work function which is becoming a barrier for the injection of holes in the organic electroluminescent layer. The barrier induced an increase of the voltage necessary to obtain the proper functioning conditions for the device.

Indeed, the performances reported in the above publication on OLEDs using a straight deposition of Ag to form the anode are worse than those using ITO. For best results the publication states that deposited Ag must be processed in a CF4 plasma to create a thin top layer (CFx) in order to reduce significantly the above mentioned barrier that otherwise prevents the effective injection of holes in the organic layer. These improved results are however obtained at the expense of the introduction of a new processing step (Ag treatment in a CF4 plasma), which further complicates the fabrication process, thus prompting to turn away from this solution.

In the field of monochromatic OLEDs other improvements have also been reported like in patent application US 2007/0001570 published by USPTO (United States patent and trademark office) on Jan. 4, 2007. The application states that color purity can be improved in a MC-OLED without impairing luminance efficiency. Notably, application discloses a bottom light-emitting OLED structure which however still requires the use of an ITO compound (ITSO) and sputtering techniques both for the deposition of ITSO and Aluminum (Al) used for the upper metal electrode. Sputtering is however a very disturbing and too energetic processing step to carry out over the already deposited organic layers of the OLED.

Therefore, in view of the foregoing, there is a need for a diode structure and a simple fabrication process of organic light emitting diodes which however permit to produce devices having very high luminance output efficiency. Especially, the process must be such that colors other than green, for which the best experimental results in terms of luminance efficiency have already been reported so far, are also improved.

Thus, it is the prime object of the invention to describe a method to obtain a bottom-emitting OLED that essentially requires simple vacuum deposition of layers of organic and metallic materials by thermal evaporation.

It is also an object of the invention to allow optical and electrical parameters to be independently adjusted so as to obtain the best possible luminance efficiency.

It is still another object of the invention to allow luminance efficiency to be independent of the physical dimensions of the devices so that they can be produced at whichever required scaling factor.

It is more specifically an object of the invention to describe a fabrication process of an OLED and an OLED device using a semi-reflective metallic anode emitting in the red with luminance efficiency greater than the experimental results reported so far.

Further objects, features and advantages of the present invention will become apparent to the ones skilled in the art upon examination of the following description in reference to the accompanying drawings. It is intended that any additional advantages be incorporated herein.

SUMMARY OF THE INVENTION

The above objects are fulfilled by the invention which describes an organic light emitting diode (OLED) emitting light downward through a transparent substrate. The OLED embeds a microcavity formed between a cathode and an anode and includes a plurality of organic layers comprising a light emitting layer. It is characterized in that the plurality of organic layers includes at least a first layer made of an organic doped material aimed at enhancing the transport of electrons; the plurality of organic layers also includes at least a second layer made of an organic doped material aimed at enhancing the transport of holes. The OLED is further characterized in that the anode is obtained by deposition of a semitransparent layer of silver (Ag) over the transparent substrate to be directly in contact with the first doped organic layer. Then, thicknesses of the first and second doped organic layers can be freely adapted to best adjust the optical characteristics of the microcavity for the wavelength of monochromatic light to be produced by the OLED.

The invention also includes following characteristics:

The cathode is obtained by deposition of a fully reflective layer of Ag.

The plurality of organic layers includes an electron blocking layer towards the first doped organic layer.

The plurality of organic layers includes a hole blocking layer towards the second doped organic layer.

The OLED is forming a layered stack successively comprising: the transparent glass substrate; the semitransparent anode made of a metal layer over the substrate. Then, the plurality of organic layers includes at least, the first layer of doped material aimed at transporting holes; the electron blocking layer towards the first layer; the light-emitting layer; the hole blocking layer towards the second layer; the second layer of doped material aimed at transporting electrons. And, finally, the fully reflective cathode made of a metal layer over the second layer.

The invention further describes a fabrication process of an OLED emitting light downward through a transparent substrate. The OLED embeds a microcavity formed between a cathode and an anode and includes a plurality of organic layers comprising a light emitting layer; the fabrication process is characterized in that:

The plurality of organic layers includes at least a first layer obtained by thermal vacuum deposition of an organic doped material aimed at enhancing the transport of electrons.

The plurality of organic layers includes at least a second layer obtained by thermal vacuum deposition of an organic doped material aimed at enhancing the transport of holes.

It is further characterized in that the anode is obtained by thermal vacuum deposition of a semitransparent layer of silver (Ag) over the transparent substrate to be directly in contact with the first doped organic layer.

The fabrication process also includes following characteristics:

Thicknesses of the first and second doped organic layers can be freely adapted to best adjust the optical characteristics of the microcavity for the wavelength of monochromatic light to be produced by the OLED.

The cathode is obtained by thermal vacuum deposition of a fully reflective layer of Ag.

The plurality of organic layers includes an electron blocking layer towards the first doped organic layer obtained by thermal vacuum deposition.

The plurality of organic layers includes a hole blocking layer towards the second doped organic layer obtained by thermal vacuum deposition.

The light-emitting layer is vertically positioned within the microcavity in order to obtain the best luminance output efficiency. The vertical positioning is obtained by independently adjusting the thicknesses of the first and second organic doped layers.

DETAILED DESCRIPTION

The following detailed description of the invention refers to the accompanying drawings. While the description includes exemplary embodiments, other embodiments are possible, and changes may be made to the embodiments described without departing from the spirit and scope of the invention.

Figure 1A:
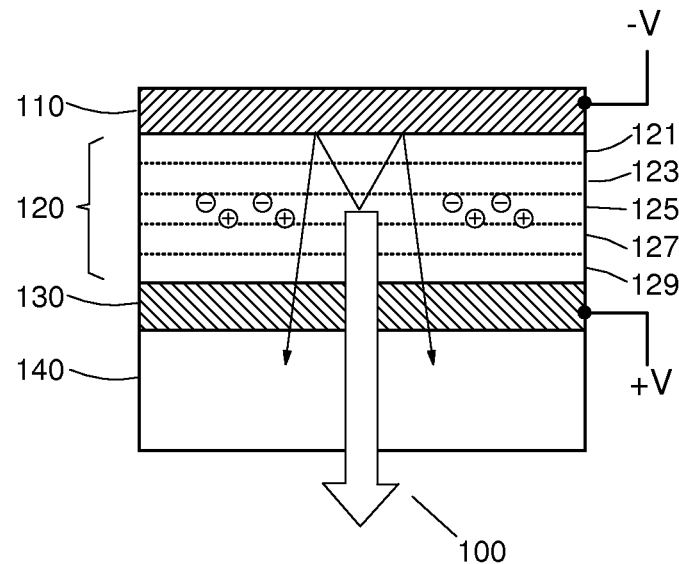
FIGS. 1a and 1b illustrate OLED structures known in the prior art.
Figure 1B:
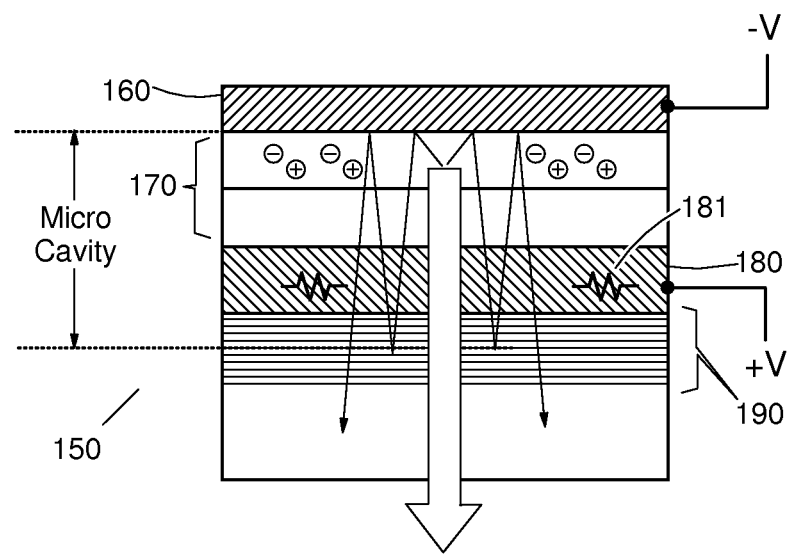
Figure 2A:
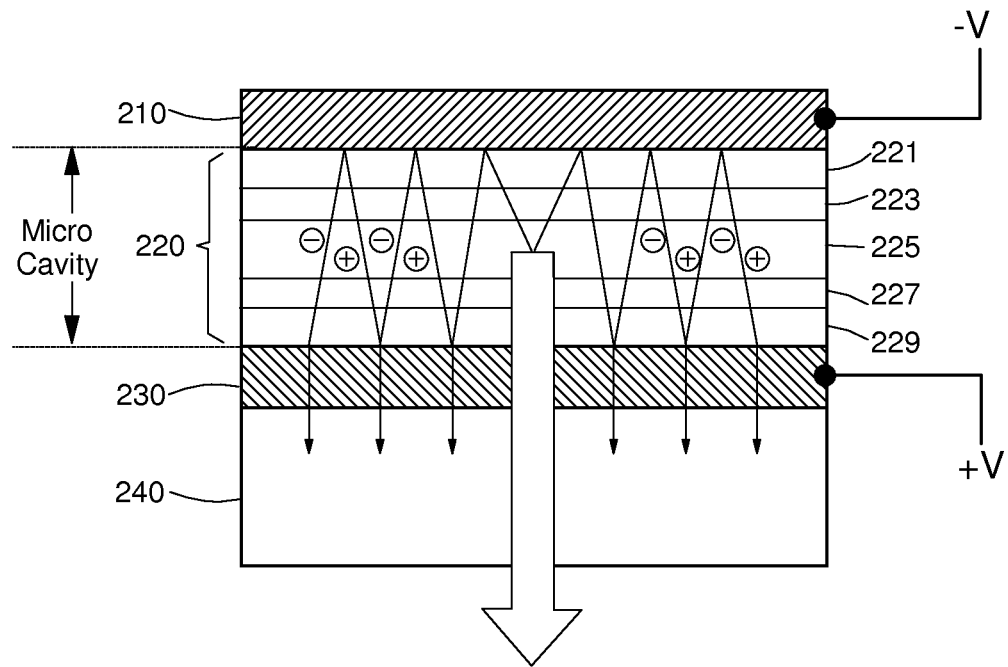
FIGS. 2a and 2b show two variants of an OLED structure according to the invention including a microcavity between two reflecting electrodes.

FIG. 2a describes the structure of an organic light emitting diode according to the invention. In such an OLED light is emitted downward, i.e., through a transparent substrate (240) made for example of glass which also provides a mechanical support to the device. The metal anode (230) is deposited directly on the substrate. The anode is, e.g., made of a layer of silver (Ag) thin enough (a few tens of nanometers) to be semitransparent in the wavelength range of the visible light: 400-700 nanometers (nm). The anode (230) is the lower mirror of the microcavity (220) that will be formed after deposition of the upper electrode (210).

Figure 2B:
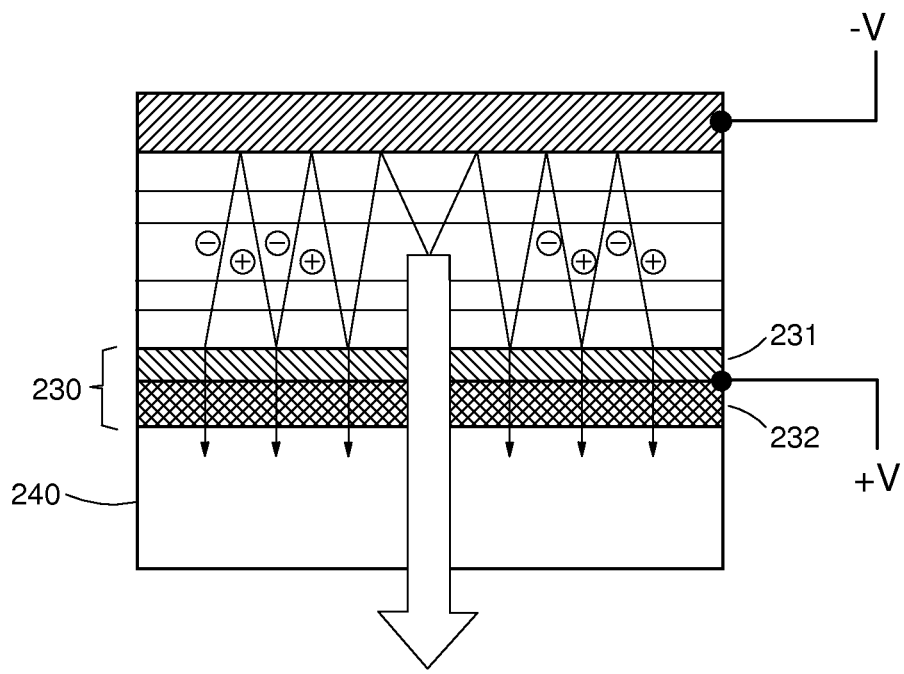

Optionally, as shown in FIG. 2b, the anode may also include a layer of transparent ITO (232) previously deposited by sputtering on the substrate (240). Although this is not mandatory, this helps further reducing the sheet resistance of the anode if necessary, e.g., for the fabrication of very large devices or for devices having a form factor detrimental for the electrical properties. Together, the layer of silver (231) and the underlying layer of transparent ITO (232) then constitute the anode (230). Because ITO is deposited first on the glass substrate, prior to the thermal vacuum deposition of the organic layers, they cannot be disturbed by the sputtering processing step. Hence, this alternate fabrication process of a bottom-emitting OLED remains compatible with the objects of the invention.

The upper electrode (210), i.e., the cathode of the device is made, e.g., by thermal vacuum deposition of aluminum or silver thick enough to be fully reflective (several hundred nanometers).

Between the anode (230) and cathode (210), the successive following layers of organic materials are deposited in a vacuum chamber by thermal evaporation:

The first organic layer (229), a few tens of nanometers thick, is used to facilitate transport of holes that are injected by the anode (230) when this latter is tied to a positive voltage. It is placed immediately above the anode. The material is doped (P-type doping) to enhance conduction by holes (i.e.: by lack of electrons). In conjunction with the layer of silver below, and optionally that of ITO (232) the electrical resistance of the anode layer (230) may be very low.

The following organic layer (227) with a thickness of about ten nanometers is used to block the electrons that could come from the upper layers and would recombine otherwise in the underlying organic layer used to facilitate transport of holes (instead of normally recombining in the electroluminescent layer).

The middle layer (225) is the organic layer where electrons and holes recombine and from where light is emitted. The thickness depends on the material used according to the color of light to emit.

The layer (223) located directly above the light-emitting layer is used to block the holes coming from the lower layers. This layer plays a role equivalent of that of layer (227) which serves to block electrons. It is about of the same thickness. Together, the blocking layers help to confine the recombination of electron-hole pairs in the intermediate light-emitting layer (225).

The top organic layer (221) is used to facilitate the transport of electrons that are injected by the cathode when tied to a negative voltage. The material is doped (N-type doping) to enhance a conduction by excess of electrons. In conjunction with the metal layer forming the reflecting cathode (210) the electrical sheet resistance is very low and independent of its thickness. Like the lower doped layer its thickness is below a few tens of nanometers.

The structure of the above organic layers (omitting the blocking layers of electrons and holes) which combines: a P-type doped layer, a non-doped (intrinsic) layer made of a luminescent material, and an N-type doped layer, is said to form a PIN structure. The materials used for this organic structure, doped or not, must have preferably a same refractive index (close to 1.7) in order not to create internal reflections that would affect the transmission of the light emitted from the intermediate light-emitting layer (225). All these materials are commercially available. They can easily be deposited by vacuum thermal evaporation.

Following gives a list of commercially available materials that can be used to realize OLEDs according to the invention:

| | |
|---|---|
| Meotpd: | N,_N,_N',_N'-_tetrakis_(4-_methoxyphenyl)_benzidine |
| Bphen: | 4,7-_Diphenyl-_1,10-_phenanthroline |
| Cs: | cesium |
| alpha-NPD: | N,N'-Di(napthalen-2-yl)-N,N'-diphenyl-benzidine |
| F4tcnQ: | tetracyanoquinodimethane |
| Ir(PIQ)3: | tris(1-phenylisoquinoline) iridium |

Above materials are used as indicated in following exemplary OLED structure:

| | |
|---|---|
| Substrate: | Glass. |
| Anode: | Ag layer, 33 nm thick. |
| P-Transport: | Meotpd layer doped with F4tcnQ in a ratio of 4%, total thickness: 38 nm. |
| N-Blocking: | pure Meotpd, 10 nm thick. |
| Light-emission: (in the red) | alpha-NPD layer doped with Ir(PIQ)$_3$ in a ratio of 15%, total thickness: 20 nm. |
| P-Blocking: | pure Bphen layer, 10 nm thick. |
| N-Transport: | Bphen layer doped with Cs in a ratio of one atom of Cs for one molecule of Bphen, giving to the layer a conductivity of about $10^{-5}$ Siemens/cm. |
| Cathode: | Ag layer, 150 nm thick. |

While doping of the organic layers cannot explain alone the observed improvement of luminance efficiency the use of doped transport layers indeed allows sheet resistance of these layers to remain low even though they need to be thin. Hence, the thickness of the layers can be freely adjusted to enhance the optical properties of OLEDs in order to obtain a microcavity (220) best adapted for the light color to generate. Thus, the height of the microcavity (220) can be adjusted so that a resonance occurs for the wavelength of the light to emit. In addition, the light-emitting layer (225) can be vertically placed (that is with an orientation according to the height of the micro cavity) exactly where within the microcavity (220) it produces a maximum of light. This is achieved by independently controlling thickness of each of the different layers forming the organic structure; mainly the P and N doped layers (221, 229). This can be done irrespective of the electrical parameters, i.e., the sheet resistance of the cathode (210) and of the anode (230) which can be kept low due to the use of doped organic materials so that voltage drops and heat dissipation remain negligible. Moreover, the deposition of a doped organic layer directly on the anode metal does not create a barrier to the injection of holes unlike the case of the deposition of an intrinsic organic material as reported in the background section. The same applies to the injection of electrons in the doped area from the cathode. This is a major contributor to obtaining high luminance efficiency.

All layers, organic and metallic, are advantageously deposited by vacuum thermal evaporation of corresponding materials.

Figure 3:
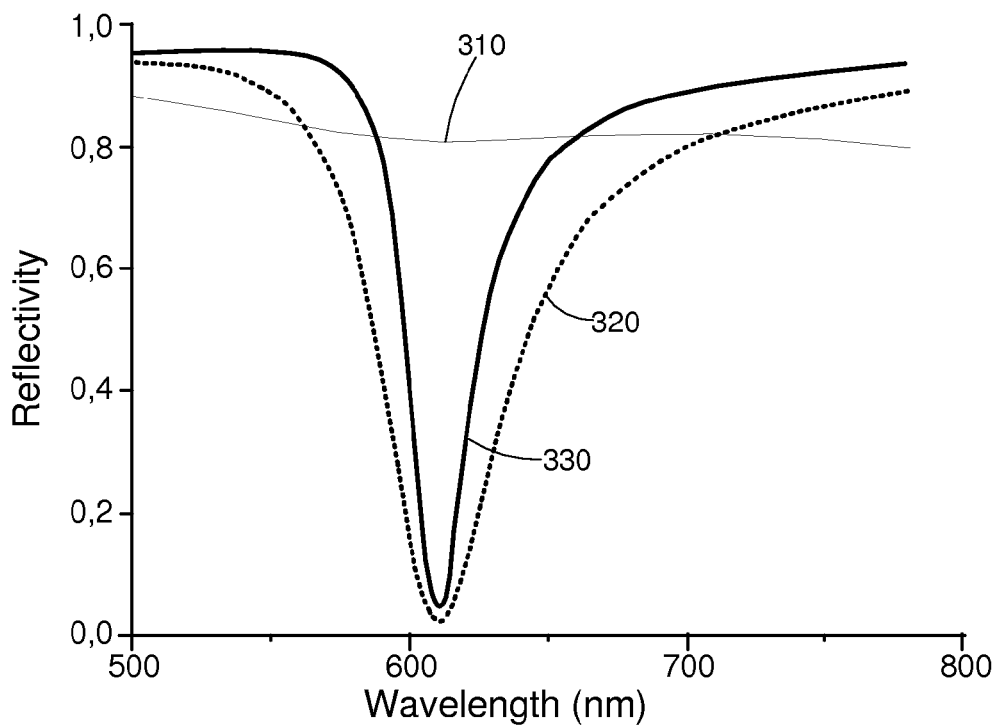
FIG. 3 illustrates the reduction of the range of wavelengths emitted by a device according to the invention corresponding to the resonance of the microcavity.

FIG. 3 illustrates the action of the microcavity on the reduction of the range of wavelengths emitted by a device as described in the previous FIGS. 2a and 2b). The reflectivity of such a layered system can be analyzed so as to obtain an optimal optical setting of the organic and metallic layers. FIG. 3 shows the results obtained with an aluminum cathode (320) and a silver cathode (330). In both cases the semi transparent anode is made of silver. The silver cathode gives a narrower spectrum of color closer to producing a pure primary color, red in this case, with a minimum reflectivity of the layered structure close to 610 nm (and thus a maximum transmission for that color). FIG. 3 also shows the reflectivity of a comparable structure (310) that does not benefit of the action of the microcavity though. This would be the case of a device as described in FIG. 2 but without the semi reflective anode. This is obtained, for example, by replacing silver, or the couple silver-ITO, by ITO. No reduction of the range of emitted wavelengths is then observed.

Figure 4:
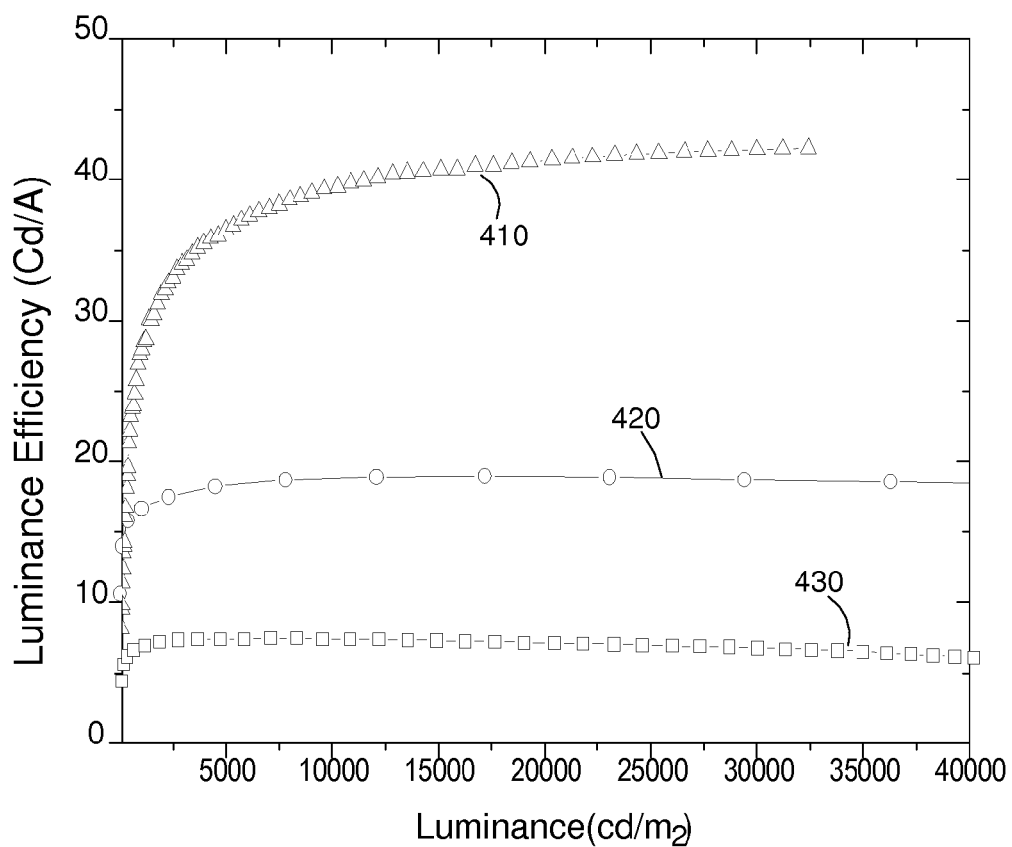
FIG. 4 compares luminance efficiencies of OLEDs obtained with the fabrication process of the invention.

FIG. 4 shows the results obtained with an OLED structure of the invention as described in FIG. 2. This serves to illustrate the magnitude of the technical progress achieved. The curves plot the luminance output efficiency, in candela per ampere (Cd/A), obtained as a function of the luminance level reached, in candela per square meters (Cd/m2). The best luminance efficiency figure is obtained with a device having a silver cathode (410). The one with an aluminum cathode (420) has a luminance efficiency figure of half the value. As far as the comparison device (430) is concerned, the one without microcavity, it is significantly worse.

The following table also shows what voltages must be applied between anode and cathode to obtain the reported luminance output efficiency for two standard values of luminance level.

|  | Voltage (volt) at 1.000 Cd/m$^2$ | Voltage (volt) at 10.000 Cd/m$^2$ | Max luminance efficiency in Cd/A |
| --- | --- | --- | --- |
| No microcavity | 2.77 | 3.6 | 7.5 |
| Aluminum cathode | 2.5 | 2.8 | 19 |
| Silver cathode | 2.65 | 2.9 | 42 |

Voltages necessary to operate an OLED of the type of FIG. 2 are fully compatible with the standard values of power supplies used by the microelectronics industry (3-5 volts). The maximum luminance efficiency obtained in the red (42 Cd/A) with the OLED structure using a silver cathode is close to the best results reported for devices emitting in the green and is significantly better than any previous results reported for OLEDs emitting in the red.

What is claimed is:

1. A process for fabricating an organic light emitting diode (OLED) emitting light downward through a transparent substrate comprising forming a layered stack successively comprising:
    a transparent substrate made of glass;
    a semitransparent anode obtained by a thermal vacuum deposition of silver material; said layer is 33 nm thick;
    a first layer aimed at transporting holes made of Meotpd material doped with F4tcnQ in a ratio of 4%; said layer is 38 nm thick and directly in contact with the semitransparent anode;
    an electron blocking layer made of pure Meotpd material; said layer is 10 nm thick;
    a light-emitting layer made of alpha-NPD material doped with Ir(PIQ)3 in a ratio of 15%; said layer is 20 nm;
    a hole blocking layer made of pure Bphen material; said layer is 10 nm thick;
    a second layer aimed at transporting electrons made of Bphen material doped with Cs in a ratio of one atom of Cs for one molecule of Bphen, given to the layer a conductivity of 10-5 Siemens/cm; and
    a fully reflective cathode, obtained by a thermal vacuum deposition, made of silver material; said layer is 150 nm thick.

2. The fabrication process of an OLED according to claim 1 wherein thicknesses of the first and second layers aimed at transporting holes are adapted to adjust the optical characteristics of the microcavity for the wavelength of monochromatic light to be produced by the OLED.

3. The fabrication process of an OLED according to claim 1 wherein the electron blocking layer contacts the first layer aimed at transporting holes and is obtained by a thermal vacuum deposition.

4. The fabrication process of an OLED according to claim 1 wherein the hole blocking layer contacts the second layer aimed at transporting holes and is obtained by a thermal vacuum deposition.

5. The fabrication process of an OLED according to claim 1 wherein the light-emitting layer is positioned within the layered stack in order to obtain the best luminance output efficiency and wherein the vertical positioning is obtained by independently adjusting the thicknesses of the first and second organic doped layers.

6. An organic light emitting diode (OLED) emitting light downward through a transparent substrate, the OLED forming a layered stack successively comprising:
    a transparent substrate made of glass;
    a semitransparent anode obtained by a thermal vacuum deposition of silver material; said layer is 33 nm thick;
    a first layer aimed at transporting holes made of Meotpd material doped with F4tcnQ in a ratio of 4%; said layer is 38 nm thick and directly in contact with the semitransparent anode;
    an electron blocking layer made of pure Meotpd material; said layer is 10 nm thick;
    a light-emitting layer made of alpha-NPD material doped with Ir(PIQ)3 in a ratio of 15%; said layer is 20 nm;
    a hole blocking layer made of pure Bphen material; said layer is 10 nm thick;
    a second layer aimed at transporting electrons made of Bphen material doped with Cs in a ratio of one atom of Cs for one molecule of Bphen, given to the layer a conductivity of 10-5 Siemens/cm; and
    a fully reflective cathode, obtained by a thermal vacuum deposition, made of silver material; said layer is 150 nm thick.

7. The OLED according to claim 6 wherein thicknesses of the first and second doped layers aimed at transporting holes are adapted to adjust the optical characteristics of the microcavity for the wavelength of monochromatic light to be produced by the OLED.

* * * * *